United States Patent
Xu et al.

(10) Patent No.: US 9,860,772 B2
(45) Date of Patent: Jan. 2, 2018

(54) METHOD AND APPARATUS FOR DETERMINING CONNECTION RELATIONSHIP BETWEEN AN ANTENNA FEEDING PORT OF BASE STATION AND AN ANTENNA PORT

(71) Applicant: Huawei Technologies Co., Ltd., Shenzhen, Guangdong (CN)

(72) Inventors: Honggang Xu, Shanghai (CN); Tao Pu, Shanghai (CN); Xiaodong Zhang, Shanghai (CN); Xiangyang Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 69 days.

(21) Appl. No.: 14/806,442

(22) Filed: Jul. 22, 2015

(65) Prior Publication Data

US 2015/0327087 A1 Nov. 12, 2015

Related U.S. Application Data

(63) Continuation of application No. PCT/CN2014/071496, filed on Jan. 26, 2014.

(30) Foreign Application Priority Data

Jan. 25, 2013 (CN) .......................... 2013 1 0029554

(51) Int. Cl.
*H04W 24/00* (2009.01)
*H04W 24/04* (2009.01)
(Continued)

(52) U.S. Cl.
CPC ............ *H04W 24/04* (2013.01); *G01R 31/00* (2013.01); *H04W 64/003* (2013.01); *H04W 24/06* (2013.01); *H04W 88/085* (2013.01)

(58) Field of Classification Search
CPC ..... H04W 24/00; H04W 24/08; H04W 16/18; H04W 88/08; H04W 16/28
(Continued)

(56) References Cited

U.S. PATENT DOCUMENTS 5,548,820 A 8/1996 Victorin
6,075,997 A 6/2000 Lindqvist et al.
(Continued)

FOREIGN PATENT DOCUMENTS

CN 1278988 A 1/2001
CN 101197468 A 6/2008
(Continued)

*Primary Examiner* — Dai A Phuong (57) ABSTRACT

Embodiments of the present invention provide a method and apparatus for determining a connection relationship between an antenna feeding port of a base station and an antenna port. The method includes: receiving, via one antenna port, a signal sent by a base station, and acquiring the signal via a Smart Bias-Tee in an antenna and a port of a remote control unit in the antenna, where the antenna port, the Smart Bias-Tee, and the port of the remote control unit are in a one-to-one correspondence; determining, according to the Smart Bias-Tee and the port of the remote control unit that acquire the signal, the antenna port that receives the signal; and sending, to the base station, identification information of the antenna port that receives the signal, and/or identification information of an antenna corresponding to the antenna port. Then accuracy and convenience in determining the connection relationship can be improved.

19 Claims, 5 Drawing Sheets

(51) Int. Cl.
*H04W 64/00* (2009.01)
*G01R 31/00* (2006.01)
H04W 88/08 (2009.01)
H04W 24/06 (2009.01)

(58) Field of Classification Search
USPC .......... 455/418–419, 423–425, 550.1–553.1, 455/562.1, 88, 575.7
See application file for complete search history.

(56) References Cited

U.S. PATENT DOCUMENTS

| | | | | |
|---|---|---|---|---|
| 6,266,545 | B1* | 7/2001 | Backman | H03G 3/004 340/538.11 |
| 8,457,700 | B2* | 6/2013 | Boss | H01Q 1/246 455/427 |
| 9,414,224 | B1* | 8/2016 | Schmidt | H04W 12/02 |
| 2003/0022691 | A1* | 1/2003 | Seki | H04B 17/327 455/560 |
| 2008/0246561 | A1* | 10/2008 | Blair | H01P 1/2084 333/212 |
| 2012/0021790 | A1* | 1/2012 | Kister | H04B 1/18 455/507 |
| 2012/0064838 | A1 | 3/2012 | Miao et al. | |
| 2012/0087450 | A1 | 4/2012 | Coldrey et al. | |
| 2013/0039402 | A1* | 2/2013 | Skarby | H04L 27/066 375/222 |

FOREIGN PATENT DOCUMENTS

| | | |
|---|---|---|
| CN | 101888023 A | 11/2010 |
| CN | 102365829 A | 2/2012 |
| CN | 102511180 A | 6/2012 |
| CN | 103096467 A | 5/2013 |
| EP | 2 219 263 A1 | 8/2010 |
| WO | WO 01/02871 A1 | 1/2001 |
| WO | WO 2011/103818 A2 | 9/2011 |

* cited by examiner

METHOD AND APPARATUS FOR DETERMINING CONNECTION RELATIONSHIP BETWEEN AN ANTENNA FEEDING PORT OF BASE STATION AND AN ANTENNA PORT

CROSS-REFERENCE TO RELATED APPLICATIONS

This application is a continuation of International Application No. PCT/CN2014/071496, filed on Jan. 26, 2014, which claims priority to Chinese Patent Application No. 201310029554.X, filed on Jan. 25, 2013, both of which are hereby incorporated by reference in their entireties.

TECHNICAL FIELD

Embodiments of the present invention relate to the field of communications technologies, and in particular, to a method and apparatus for determining a connection relationship between an antenna feeding port of a base station and an antenna port.

BACKGROUND

In a wireless base station system, a plurality of base stations often needs to be deployed at one site, and correspondingly a plurality of antennas needs to be installed, where the base stations and the antennas are connected by feeders.

Figure 1:
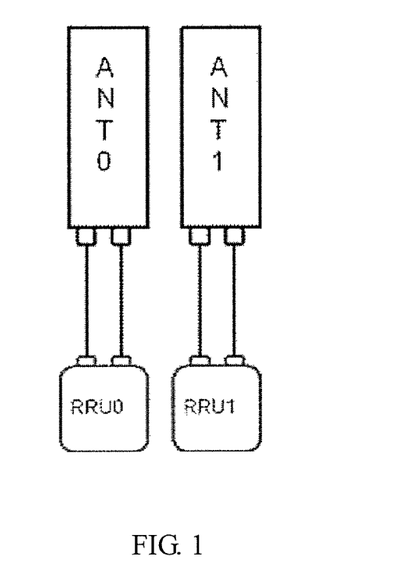
FIG. 1 is a schematic diagram depicting a correct connection relationship between an antenna feeding port of a base station and an antenna port in the prior art.
Figure 2:
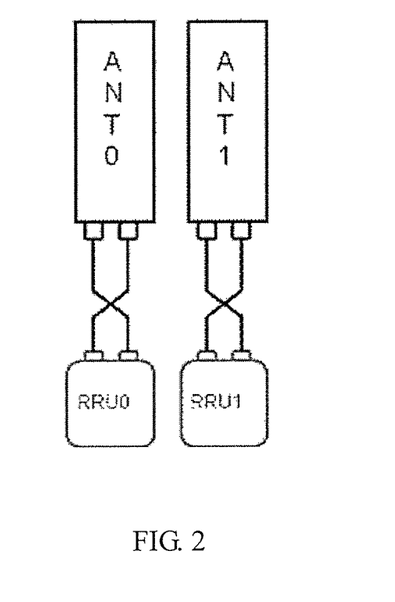
FIG. 2 and FIG. 3 are schematic diagrams depicting an incorrect connection relationship between an antenna feeding port of a base station and an antenna port in the prior art.
Figure 3:
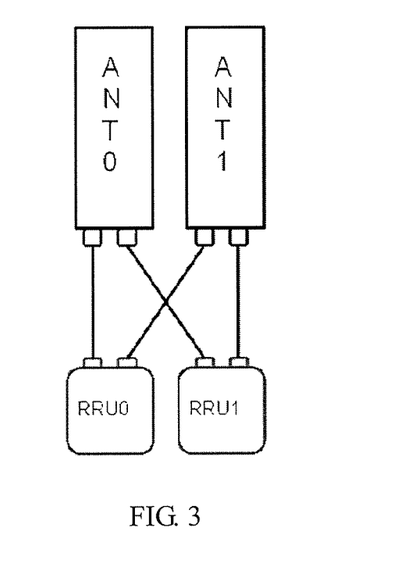

FIG. 1 is a schematic diagram illustrating a correct connection relationship between an antenna feeding port of base stations and an antenna port in the prior art. Ports of an antenna (Antenna, ANT for short) and each antenna feeding port of a remote RF unit (Remote RF Unit, RRU for short) of each base station are connected in a one-to-one fashion by a feeder. Since feeders have a same physical appearance, the process of manually connecting antenna feeding ports to antenna ports of plural antennas on a same pole or tower would be error prone. FIG. 2 and FIG. 3 are schematic diagrams depicting an incorrect connection relationship between an antenna feeding port of a base station and an antenna port in the prior art. In FIG. 2, two feeders of a same antenna are cross-connected to ports of a base station. In FIG. 3, feeders of different antennas are cross-connected to ports of different base stations.

At present, typically, a detection of whether a connection relationship between an antenna feeding port of a base station and an antenna port is correct is performed only after an abnormal situation is detected in a network optimization process that is carried out following completion of base station deployment. For example, the abnormal situation may be a large difference between a primary transmit level and a diversity receive level in a cell. Alternatively, correctness of a connection relationship between an antenna feeding port of a base station and an antenna port may be determined by testing isolation between antennas. For example, isolation between antennas in a same cell should be more than 5 db lower than isolation between antennas in different cells.

However, the foregoing solutions for checking a connection relationship between an antenna feeding port of a base station and an antenna port in the prior art has low accuracy, and in some of the solutions, a connection relationship check can be performed only when the base station is running an actual service, thereby resulting in low accuracy and inconvenience.

SUMMARY

Embodiments of the present invention provide a method and apparatus for determining a connection relationship between an antenna feeding port of a base station and an antenna port, so as to improve accuracy and convenience in determining.

According to a first aspect, an embodiment of the present invention provides a method for determining a connection relationship between an antenna feeding port of a base station and an antenna port, including:

receiving, via one antenna port after another, a signal for determining the connection relationship sent by the base station, and acquiring the signal for determining the connection relationship via a Smart Bias-Tee in an antenna and a port of a remote control unit in the antenna, where the antenna port, the Smart Bias-Tee, and the port of the remote control unit are in a one-to-one correspondence;

determining, according to the Smart Bias-Tee and the port of the remote control unit that acquire the signal for determining the connection relationship, the antenna port that receives the signal for determining the connection relationship; and sending, to the base station, identification information of the antenna port that receives the signal for determining the connection relationship, and/or identification information of an antenna corresponding to the antenna port.

In a first possible implementation of the first aspect, the signal for determining the connection relationship is a binary on-off keying signal.

In a second possible implementation of the first aspect, each antenna and each remote control unit are in a one-to-one correspondence, and the identification information of the antenna is a serial number of a control board in the remote control unit in the antenna.

In a third possible implementation of the first aspect, the receiving, via one antenna port after another, a signal for determining the connection relationship sent by the base station, and acquiring the signal for determining the connection relationship via a Smart Bias-Tee in an antenna and a port of a remote control unit in the antenna includes:

receiving, via one antenna port after another, a test signal sent by the base station;

performing, via the Smart Bias-Tee in the antenna, signal separation on the test signal to acquire the signal for determining the connection relationship; and transmitting the signal for determining the connection relationship that is separated out to the correspondingly connected port of the remote control unit.

According to a second aspect, an embodiment of the present invention provides a method for determining a connection relationship between an antenna feeding port of a base station and an antenna port, including:

sending a signal for determining the connection relationship to a correspondingly connected antenna port via an antenna feeding port of the base station, and recording identification information of the antenna feeding port of the base station;

receiving identification information of the antenna port and/or identification information of an antenna corresponding to the antenna port returned via the antenna port; and determining a connection relationship between the antenna feeding port of the base station and the antenna port according to the recorded identification information of the antenna feeding port of the base station, the identification information of the antenna, and the identification information of the antenna port.

In a first possible implementation of the second aspect, the sending a signal for determining the connection relationship to a correspondingly connected antenna port via an antenna feeding port of the base station, and recording identification information of the antenna feeding port of the base station includes:

sending a test signal to the correspondingly connected antenna port via the antenna feeding port of the base station, where the test signal carries the signal for determining the connection relationship; and recording the identification information of the antenna feeding port of the base station.

In a second possible implementation of the second aspect, the signal for determining the connection relationship is a binary on-off keying signal.

According to a third aspect, an embodiment of the present invention provides an apparatus for determining a connection relationship between an antenna feeding port of a base station and an antenna port, including:

an acquiring module, configured to receive, via one antenna port after another, a signal for determining the connection relationship sent by the base station, and acquire the signal for determining the connection relationship via a Smart Bias-Tee in an antenna and a port of a remote control unit in the antenna, where the antenna port, the Smart Bias-Tee, and the port of the remote control unit are in a one-to-one correspondence;

a determining module, configured to determine, according to the Smart Bias-Tee and the port of the remote control unit that acquire the signal for determining the connection relationship, the antenna port that receives the signal for determining the connection relationship; and a first sending module, configured to send, to the base station, identification information of the antenna port that receives the signal for determining the connection relationship, and/or identification information of an antenna corresponding to the antenna port.

In a first possible implementation of the third aspect, the signal for determining the connection relationship is a binary on-off keying signal.

In a second possible implementation of the third aspect, each antenna and each remote control unit are in a one-to-one correspondence, and the identification information of the antenna is a serial number of a control board in the remote control unit in the antenna.

In a third possible implementation of the third aspect, the acquiring module includes:

a receiving unit, configured to receive, via one antenna port after another, a test signal sent by the base station;

a separation unit, configured to perform, via the Smart Bias-Tee in the antenna, signal separation on the test signal to acquire the signal for determining the connection relationship; and a transmission unit, configured to transmit the signal for determining the connection relationship that is separated out to the correspondingly connected port of the remote control unit.

According to a fourth aspect, an embodiment of the present invention provides an apparatus for determining a connection relationship between an antenna feeding port of a base station and an antenna port, including:

a second sending module, configured to send a signal for determining the connection relationship to a correspondingly connected antenna port via an antenna feeding port of the base station, and record identification information of the antenna feeding port of the base station;

a receiving module, configured to receive identification information of the antenna port and/or identification information of an antenna corresponding to the antenna port returned via the antenna port; and a determining module, configured to determine a connection relationship between the antenna feeding port of the base station and the antenna port according to the recorded identification information of the antenna feeding port of the base station, the identification information of the antenna, and the identification information of the antenna port.

In a first possible implementation of the fourth aspect, the second sending module is specifically configured to: send a test signal to the correspondingly connected antenna port via the antenna feeding port of the base station, where the test signal carries the signal for determining the connection relationship; and record the identification information of the antenna feeding port of the base station.

In a second possible implementation of the fourth aspect, the signal for determining the connection relationship is a binary on-off keying signal.

According to a fifth aspect, an embodiment of the present invention provides a base station system, including a base station with an antenna feeding port and an antenna with a port, the antenna feeding port of the base station and the antenna port are connected in a one-to-one fashion, where the antenna further includes:

a Smart Bias-Tee, in a one-to-one correspondence with the antenna port, and configured to separate and acquire the signal for determining the connection relationship received from the antenna port;

a remote control unit, where a port of the remote control unit and the Smart Bias-Tee are connected in a one-to-one manner; and the apparatus for determining a connection relationship between an antenna feeding port of a base station and an antenna port according to any embodiment of the present invention, where the apparatus is set in the remote control unit.

In a first possible implementation of the fifth aspect, a quantity of antennas is at least two, and a quantity of remote control units matches a quantity of antennas.

According to the technical solutions provided by the embodiments of the present invention, a signal for determining the connection relationship sent by a base station is acquired via a Smart Bias-Tee in an antenna and a port of a remote control unit in the antenna; an antenna port that receives the signal for determining the connection relationship is determined according to the Smart Bias-Tee and the port of the remote control unit that acquire the signal for determining the connection relationship; and then, identification information of the antenna port that receives the signal for determining the connection relationship and identification information of the antenna corresponding to the antenna port may be obtained, thereby improving accuracy and convenience in determining.

BRIEF DESCRIPTION OF THE DRAWINGS

To describe the technical solutions in the embodiments of the present invention more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

To make the objectives, technical solutions, and advantages of the present invention clearer, the following clearly describes the technical solutions in the present invention with reference to the accompanying drawings in the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

Figure 4:
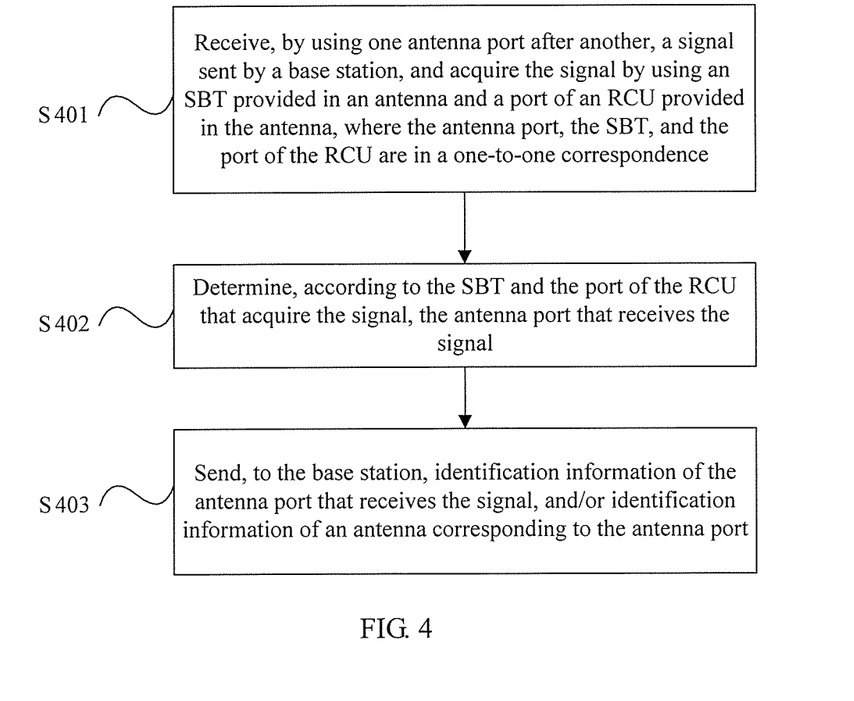
FIG. 4 is a flowchart illustrating Embodiment 1 of a method for determining a connection relationship between an antenna feeding port of a base station and an antenna port according to the present invention.
Figure 6:
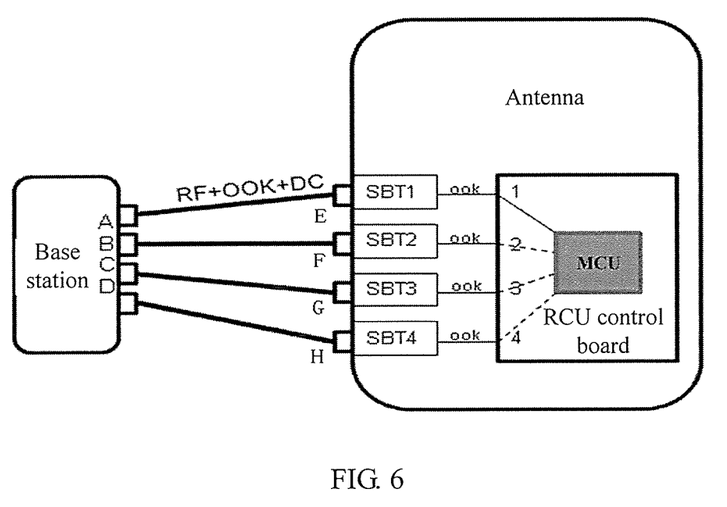
FIG. 6 is a schematic structural diagram depicting a connection relationship between an antenna feeding port of a base station and an antenna port according to the present invention.

FIG. 4 is a flowchart illustrating Embodiment 1 of a method for determining a connection relationship between an antenna feeding port of base station and an antenna port according to the present invention. The determining method according to this embodiment is applicable to determining a connection relationship between a base station and an antenna. FIG. 6 shows a connection architecture used between an antenna and a base station according to the method. The antenna includes a plurality of antenna ports, which are shown in FIG. 6 as port E, port F, port G, and port H. A smart feeding unit (also called Smart Bias-Tee, SBT for short) is connected to each port, and the SBTs are shown in FIG. 6 as SBT1 to SBT4. Typically, a remote control unit (Remote Control Unit, RCU for short) is further set in the antenna. A micro control unit (Micro Control Unit, MCU for short) is set in a control board of the RCU. A port of the RCU is correspondingly connected to each SBT. The port of the RCU may be, for example, an input/output interface of the MCU. The base station includes a plurality of antenna feeding ports, which are, for example, shown in FIG. 6 as antenna feeding port A, antenna feeding port B, antenna feeding port C, and antenna feeding port D. The antenna feeding port and the antenna port are connected in a one-to-one fashion. However, the connection relationship may be incorrect due to misoperation. This embodiment is directed towards a detection of the connection relationship.

The method may be performed by a determining apparatus. The determining apparatus may be set in an RCU of an antenna. As shown in FIG. 4, the method according to this embodiment may include:

S401: Receive, via one antenna port after another, a signal for determining the connection relationship sent by a base station, and acquire the signal for determining the connection relationship via an SBT in an antenna and a port of an RCU in the antenna, where the antenna port, the SBT, and the port of the RCU have a one-to-one correspondence.

Specifically, the base station determines a connection relationship between each antenna feeding port of the base station and an antenna port in turn. For example, when the base station determines a connection relationship between antenna feeding port A of the base station and an antenna port, the base station sends the signal for determining the connection relationship to the antenna via antenna feeding port A, and antenna port E connected to antenna feeding port A may receive the signal for determining the connection relationship. Each antenna port is connected to one SBT in the antenna, and each SBT in the antenna is also correspondingly connected to one antenna port. Therefore, the signal for determining the connection relationship received by port E may be acquired via SBT1 in the antenna and port 1 of the RCU in the antenna.

S402: Determine, according to the SBT and the port of the RCU that acquire the signal for determining the connection relationship, an antenna port that receives the signal for determining the connection relationship.

Specifically, because an antenna port, an SBT, and a port of the RCU are in a one-to-one correspondence, a determining apparatus may determine, according to the SBT and the port of the RCU that acquire the signal for determining the connection relationship, the antenna port that receives the signal for determining the connection relationship.

S403: Send, to the base station, identification information of the antenna port that receives the signal for determining the connection relationship, and/or identification information of an antenna corresponding to the antenna port.

After determining the antenna port that receives the signal for determining the connection relationship, the determining apparatus may send the identification information of the antenna port and/or the identification information of the antenna corresponding to the antenna port to the base station. This step is specifically: returning the identification information to the base station via the port that receives the signal for determining the connection relationship, so that the base station may learn at least one of the identification information of the antenna and the identification information of the antenna port, where the antenna and the antenna port are connected to an antenna feeding port that sends the signal for determining the connection relationship and is of the base station.

In this embodiment, a signal for determining the connection relationship sent by a base station is acquired via an SBT in an antenna and a port of an RCU in the antenna, and an antenna port that receives the signal for determining the connection relationship is determined according to the SBT and the port of the RCU that acquire the signal for determining the connection relationship; and then, identification information of the antenna port that receives the signal for determining the connection relationship and/or identification information of the antenna corresponding to the antenna port may be obtained, thereby improving accuracy and convenience in determining.

In the determining method, the signal for determining the connection relationship is a binary on-off keying signal by way of example. When determining a connection relationship between the antenna feeding port of a base station and the antenna port, the base station may use an OOK (On-Off Keying, on-off keying) signal, or may use another signal for determining the connection relationship.

According to the determining method, each antenna and each remote control unit are in a one-to-one correspondence, and the identification information of the antenna may be represented by a serial number of a control board in the remote control unit in the antenna. An RCU is set in an antenna, and a serial number of one RCU control board in the antenna may be chosen as an identifier of the antenna.

According to the foregoing determining method, the receiving, via one antenna port after another, a signal for determining the connection relationship sent by a base station, and the acquiring the signal for determining the connection relationship via a Smart Bias-Tee in an antenna and a port of a remote control unit in the antenna may include:

receiving, via one antenna port after another, a test signal sent by the base station; where specifically, the base station performs testing on all the antenna feeding ports of the base station one after another, and correspondingly, an antenna end also receives, via one antenna port after another, the test signal sent by the base station;

performing, via the Smart Bias-Tee in the antenna, signal separation on the test signal to acquire the signal for determining the connection relationship; where specifically, the test signal sent by the base station not only includes the signal for determining the connection relationship for determining a connection relationship between the antenna feeding port of the base station and the antenna port, but also includes another signal such as a direct current signal for providing operating voltage for the antenna; the SBT in the antenna has a signal separation function, and may separate the signal for determining the connection relationship from the test signal; for example, an OOK signal and a direct current signal may be used as the test signal, and the OOK signal may be separated according to a preset policy from the test signal and used as the signal for determining the connection relationship; and transmitting the separated signal for determining the connection relationship to a correspondingly connected port of the remote control unit.

Because the SBT and the port of the RCU are connected to each other, the SBT further transmits the signal for determining the connection relationship to the RCU after separating the signal for determining the connection relationship from the test signal. The RCU then determines, according to the one-to-one correspondence between an antenna port, the SBT, and the port of the RCU, the antenna port that receives the test signal, namely, the antenna port that receives the signal for determining the connection relationship.

In this embodiment, an SBT in an antenna performs signal separation for a test signal sent by a base station, acquires a signal for determining the connection relationship, and transmits the signal for determining the connection relationship to an RCU; the RCU then determines, according to a one-to-one correspondence between an antenna port, the SBT, and a port of the RCU, the antenna port that receives the signal for determining the connection relationship; and then, identification information of the antenna port that receives the signal for determining the connection relationship and/or identification information the antenna corresponding to the antenna port may be obtained, thereby improving accuracy and convenience in determining.

Figure 5:
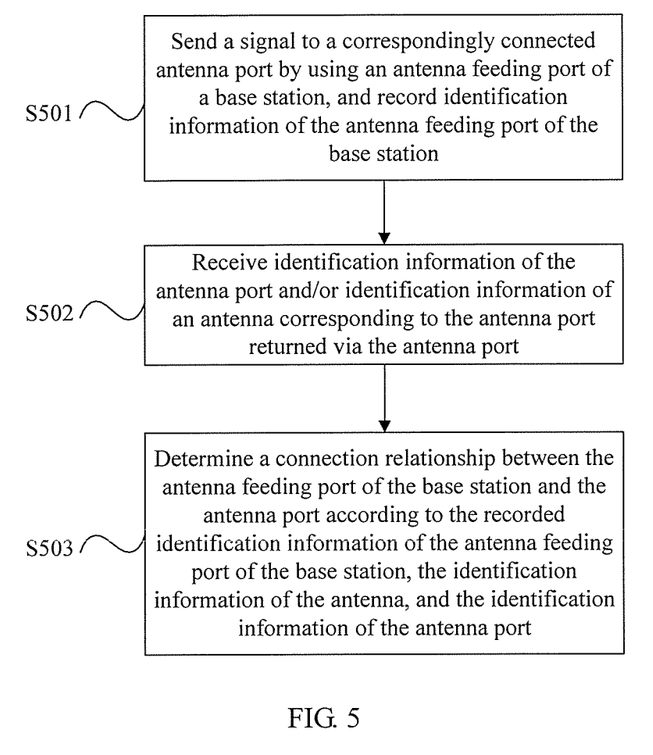
FIG. 5 is a flowchart illustrating Embodiment 2 of a method for determining a connection relationship between an antenna feeding port of a base station and an antenna port according to the present invention.

FIG. 5 is a flowchart illustrating a method for determining a connection relationship between an antenna feeding port of a base station and an antenna port according to Embodiment 2 of the present invention. This embodiment is performed by a determining apparatus in a base station. For a connection architecture used between an antenna and the base station, refer to FIG. 6. As shown in FIG. 5, the method according to this embodiment may include:

S501: Send a signal for determining the connection relationship to a correspondingly connected antenna port via an antenna feeding port of the base station, and record identification information of the antenna feeding port of the base station.

The base station determines a connection relationship between each antenna feeding port of the base station and an antenna port in turn. Specifically, the base station sends a signal for determining the connection relationship to a correspondingly connected antenna port via a determined antenna feeding port, and records identification information of the antenna feeding port.

S502: Receive identification information of the antenna port and/or identification information of an antenna corresponding to the antenna port returned via the antenna port.

After receiving the signal for determining the connection relationship sent by the base station, an antenna end determines the antenna port that receives the signal for determining the connection relationship, and returns, to the base station, the identification information of the antenna port that receives the signal for determining the connection relationship and/or the identification information of the antenna corresponding to the antenna port.

S503: Determine a connection relationship between the antenna feeding port of the base station and the antenna port according to the recorded identification information of the antenna feeding port of the base station, at least one of the identification information of the antenna and the identification information of the antenna port.

The base station may determine a specific connection relationship between the antenna feeding port of the base station and the antenna port according to the recorded identification information of the antenna feeding port that sends the signal for determining the connection relationship and is of the base station, and at least one of the identification information, returned by the antenna end, of the antenna port that receives the signal for determining the connection relationship and the identification information, returned by the antenna end, of the antenna corresponding to the antenna port.

In this embodiment, a signal for determining the connection relationship is sent to an antenna end via an antenna feeding port of a base station, and then identification information, returned by the antenna end, of an antenna port and/or identification information, returned by the antenna end, of an antenna corresponding to the antenna port are received; and then a specific connection relationship between the antenna feeding port of the base station and the antenna port may be determined, thereby improving accuracy and convenience in determining.

According to the foregoing determining method, the sending a signal for determining the connection relationship to a correspondingly connected antenna port via an antenna feeding port of the base station, and the recording identification information of the antenna feeding port of the base station include:

sending a test signal to the correspondingly connected antenna port via the antenna feeding port of the base station, where the test signal carries the signal for determining the connection relationship; and recording the identification information of the antenna feeding port of the base station.

Specifically, the test signal sent to the antenna port by the base station not only includes the signal for determining the connection relationship for determining the connection relationship between the antenna feeding port of the base station and the antenna port, but also includes another signal such as a direct current signal for providing operating voltage for the antenna.

In the determining method, by way of example, the signal for determining the connection relationship is a binary on-off keying signal. When determining a connection relationship between the antenna feeding port of a base station and the antenna port, the base station may use an OOK (On-Off Keying, on-off keying) signal, or may use another signal for determining the connection relationship.

FIG. 6 is a schematic structural diagram depicting a correct connection relationship between an antenna feeding port of a base station and an antenna port according to the present invention. There is one RCU control board in the antenna. A port of the RCU is specifically an interface of an MCU on the RCU control board. Corresponding to each antenna port, an SBT is set in the antenna, and the SBT is connected to a port of the RCU, so that the antenna port, the SBT, and the port of the RCU are connected in a one-to-one fashion. For example, four SBTs are in the antenna in FIG. 6, namely, SBT1, SBT2, SBT3, and SBT4, and correspondingly SBT1, SBT2, SBT3, and SBT4 are connected to port 1, port 2, port 3, and port 4 of the RCU, respectively.

After installation of the base station and the antenna is completed, detection of the connection relationship between the antenna feeding port of the base station and the antenna port may be started. Assume that a test signal is sent from port A of the base station. The test signal output from port A includes a radio frequency signal RF, a direct current signal DC, and a signal for determining the connection relationship OOK. The signal for determining the connection relationship OOK is separated from the test signal by means of a separation function of an SBT in the antenna, and the OOK signal is transmitted to the MCU on the RCU control board. A determining apparatus in the MCU may determine, according to the SBT and a port of the RCU that receive the OOK signal, an antenna port that receives the OOK signal. For example, if port 1 of the RCU receives the OOK signal, it indicates that port E of the antenna is connected to antenna feeding port A of the base station. If port 2 of the RCU receives the OOK signal, it indicates that port F of the antenna is connected to antenna feeding port A of the base station.

A plurality of base stations is typically deployed at one site, and correspondingly a plurality of antennas is installed. Therefore, a connection relationship between base stations and antennas also needs to be determined. For example, in FIG. 6, after receiving the OOK signal, the determining apparatus may return to the base station a serial number of the RCU control board in the antenna. The serial number of the RCU control board is used as antenna identification information to determine whether the base station is connected to an antenna corresponding to the base station.

Figure 7:
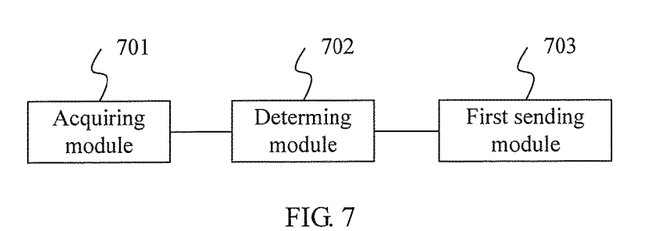
FIG. 7 is a schematic diagram depicting Embodiment 1 of an apparatus for determining a connection relationship between an antenna feeding port of a base station and an antenna port according to the present invention.

FIG. 7 is a schematic diagram illustrating Embodiment 1 of an apparatus for determining a connection relationship between an antenna feeding port of a base station and an antenna port according to the present invention. As shown in FIG. 7, the apparatus for determining a connection relationship between an antenna feeding port of a base station and an antenna port according to this embodiment may include an acquiring module 701, a determining module 702, and a first sending module 703. The acquiring module 701 is configured to receive, via one antenna port after another, a signal for determining the connection relationship sent by a base station, and acquire the signal for determining the connection relationship via a Smart Bias-Tee in an antenna and a port of a remote control unit in the antenna, where the antenna port, the Smart Bias-Tee, and the port of the remote control unit are in a one-to-one correspondence; the determining module 702 is configured to determine, according to the Smart Bias-Tee and the port of the remote control unit that acquire the signal for determining the connection relationship, the antenna port that receives the signal for determining the connection relationship; and the first sending module 703 is configured to send, to the base station, identification information of the antenna port that receives the signal for determining the connection relationship, and/or identification information of an antenna corresponding to the antenna port.

The apparatus for determining a connection relationship between an antenna feeding port of a base station and an antenna port according to this embodiment may be configured to practice the method of the method embodiment shown in FIG. 4, and has corresponding functional modules. An implementation principle and a technical effect of the apparatus are similar to those of the method, and will not be described herein again.

According to the foregoing determining apparatus, the signal for determining the connection relationship is a binary on-off keying signal.

According to the foregoing determining apparatus, each antenna and each remote control unit are in a one-to-one correspondence, so that the identification information of the antenna is a serial number of a control board in the remote control unit in the antenna.

According to the foregoing determining apparatus, the acquiring module 701 includes: a receiving unit, a separation unit, and a transmission unit. The receiving unit is configured to receive, via one antenna port after another, a test signal sent by the base station; the separation unit is configured to perform, via the Smart Bias-Tee in the antenna, signal separation on the test signal to acquire the signal for determining the connection relationship; and the transmission unit is configured to transmit the signal for determining the connection relationship that is separated out to the correspondingly connected port of the remote control unit.

The apparatus for determining a connection relationship between an antenna feeding port of a base station and an antenna port according to this embodiment is used to practice the method, provided by the foregoing embodiment of the present invention, for determining a connection relationship between an antenna feeding port of a base station and an antenna port. An implementation principle and a technical effect thereof have been described above, and will not be described herein again.

Figure 8:
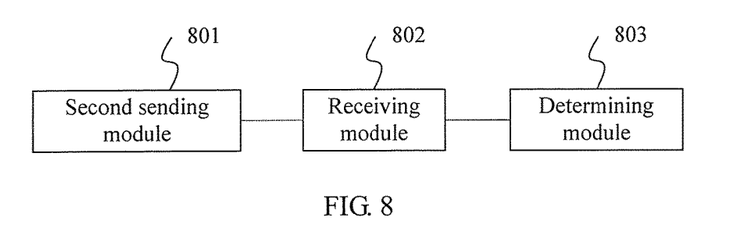
FIG. 8 is a schematic diagram depicting Embodiment 2 of an apparatus for determining a connection relationship between an antenna feeding port of a base station and an antenna port according to the present invention.

FIG. 8 is a schematic diagram illustrating Embodiment 2 of an apparatus for determining a connection relationship between an antenna feeding port of a base station and an antenna port according to the present invention. As shown in FIG. 8, the apparatus for determining a connection relationship between an antenna feeding port of a base station and an antenna port according to this embodiment may include a second sending module 801, a receiving module 802, and a determining module 803. The second sending module 801 is configured to send a signal for determining the connection relationship to a correspondingly connected antenna port via an antenna feeding port of the base station, and record identification information of the antenna feeding port of the base station; the receiving module 802 is configured to receive identification information of the antenna port and/or identification information of an antenna corresponding to the antenna port returned via the antenna port; and the determining module 803 is configured to determine a connection relationship between the antenna feeding port of the base station and the antenna port according to the recorded identification information of the antenna feeding port of the base station, the identification information of the antenna, and the identification information of the antenna port.

The apparatus for determining a connection relationship between an antenna feeding port of a base station and an antenna port according to this embodiment may be used to practice the method of the method embodiment shown in FIG. 5, and has corresponding functional modules. An implementation principle and a technical effect of the apparatus are similar to those of the method, and will not be described again.

According to the foregoing determining apparatus, the second sending module 801 may be specifically configured to: send a test signal to the correspondingly connected antenna port via the antenna feeding port of the base station, where the test signal carries the signal for determining the connection relationship; and record the identification information of the antenna feeding port of the base station.

The implementation principle and the technical effect of the apparatus for determining a connection relationship between an antenna feeding port of a base station and an antenna port according to this embodiment have been described above, and will not be described herein again.

According to the foregoing determining apparatus, the signal for determining the connection relationship is a binary on-off keying signal.

Figure 9:
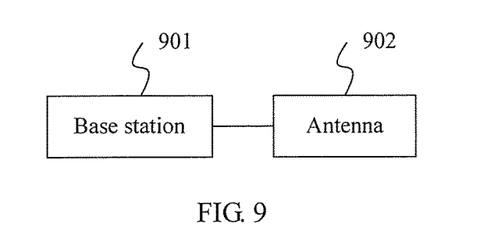
FIG. 9 is a schematic structural diagram of a base station system according to an embodiment of the present invention.

FIG. 9 is a schematic structural diagram of a base station system according to an embodiment of the present invention. As shown in FIG. 9, the base station system according to this embodiment may include a base station 901 with an antenna feeding port and an antenna 902 with a port. The antenna feeding port of the base station and the antenna port are connected in a one-to-one fashion, where the antenna 902 further includes: a Smart Bias-Tee, a remote control unit, and a determining apparatus.

Referring to FIG. 6, each Smart Bias-Tee is in a one-to-one correspondence with an antenna port, and is configured to separate and acquire a signal for determining the connection relationship received from the antenna port; a port of the remote control unit and the Smart Bias-Tee are connected in a one-to-one fashion; and the determining apparatus for determining a connection relationship between an antenna feeding port of a base station and an antenna port is set in the remote control unit. An implementation principle and a technical effect of the base station system have been described above, and will not be described herein again.

According to the foregoing base station system, a quantity of antennas is at least two, and a quantity of remote control units matches a quantity of antennas.

When a plurality of base stations is deployed at one site, correspondingly a plurality of antennas is deployed. When the number of RCUs matches the number of antennas, a serial number of an RCU control board may be used as antenna identification information to determine whether a base station is connected to an antenna corresponding to the base station.

Figure 10:
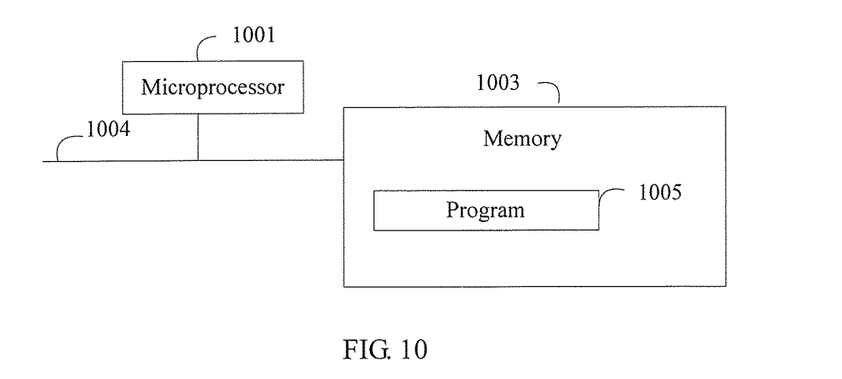
FIG. 10 is a schematic structural diagram of an antenna according to an embodiment of the present invention.

FIG. 10 is a schematic structural diagram of an antenna according to an embodiment of the present invention. As shown in FIG. 10, the antenna includes at least one microprocessor 1001 (such as an MCU), a memory 1003, and at least one communications bus 1004 configured to realize connection and communication between devices. The microprocessor 1001 is configured to execute an executable module stored in the memory 1003, such as a computer program. The memory 1003 may include a high-speed random access memory (RAM: Random Access Memory), and may also include a non-volatile memory (non-volatile memory) such as at least one magnetic disk memory.

In some implementations, the memory 1003 stores a program 1005. The program 1005 may be executed by the microprocessor 1001. This program includes execution of a method for determining a connection relationship between an antenna feeding port of a base station and an antenna port, and the method includes:

receiving, via one antenna port after another, a signal for determining the connection relationship sent by a base station, and acquiring the signal for determining the connection relationship via a Smart Bias-Tee in an antenna and a port of a remote control unit in the antenna, where the antenna port, the Smart Bias-Tee, and the port of the remote control unit are in a one-to-one correspondence;

determining, according to the Smart Bias-Tee and the port of the remote control unit that acquire the signal for determining the connection relationship, an antenna port that receives the signal for determining the connection relationship; and sending, to the base station, identification information of the antenna port that receives the signal for determining the connection relationship, and/or identification information of the antenna corresponding to the antenna port.

According to the foregoing program for executing the method for determining a connection relationship between an antenna feeding port of a base station and an antenna port, preferably, the signal for determining the connection relationship is a binary on-off keying signal.

According to the foregoing program for executing the method for determining a connection relationship between an antenna feeding port of a base station and an antenna port, preferably, antennas and remote control units are in a one-to-one correspondence, and the identification information of the antenna is a serial number of a control board in the remote control unit in the antenna.

According to the foregoing program for executing the method for determining a connection relationship between an antenna feeding port of a base station and an antenna port, preferably, the receiving, via one antenna port after another, a signal for determining the connection relationship sent by a base station, and acquiring the signal for determining the connection relationship via a Smart Bias-Tee in an antenna and a port of a remote control unit in the antenna includes:

receiving, via one antenna port after another, a test signal sent by the base station;

performing, via the Smart Bias-Tee in the antenna, signal separation on the test signal to acquire the signal for determining the connection relationship;

transmitting the signal for determining the connection relationship that is separated out to the correspondingly connected port of the remote control unit.

Figure 11:
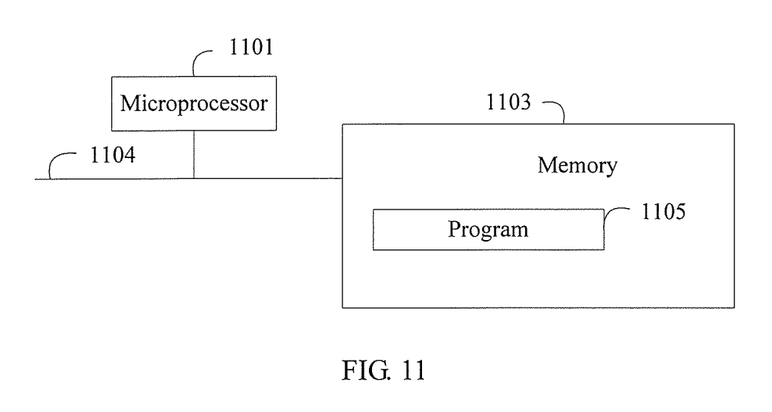
FIG. 11 is a schematic structural diagram of a base station according to an embodiment of the present invention.

FIG. 11 is a schematic structural diagram of a base station according to an embodiment of the present invention. As shown in FIG. 11, the base station includes at least one microprocessor 1101 (such as an MCU), a memory 1103, and at least one communications bus 1104 configured to realize connection and communication between devices. The microprocessor 1101 is configured to execute an executable module stored in the memory 1103, such as a computer program. The memory 1103 may include a high-speed random access memory (RAM: Random Access Memory), and may also include a non-volatile memory (non-volatile memory) such as at least one magnetic disk memory.

In some implementations, the memory 1103 stores a program 1105. The program 1105 may be executed by the microprocessor 1101. This program includes execution of a method for determining a connection relationship between an antenna feeding port of a base station and an antenna port, and the method includes:

sending a signal for determining the connection relationship to a correspondingly connected antenna port via an antenna feeding port of a base station, and recording identification information of the antenna feeding port of the base station;

receiving identification information of the antenna port and/or identification information of an antenna corresponding to the antenna port returned via the antenna port; and determining a connection relationship between the antenna feeding port of the base station and the antenna port according to the recorded identification information of the antenna feeding port of the base station, at least one of the identification information of the antenna, and the identification information of the antenna port.

According to the foregoing program for executing the method for determining a connection relationship between an antenna feeding port of a base station and an antenna port, preferably, the sending a signal for determining the connection relationship to a correspondingly connected antenna port via an antenna feeding port of a base station, and recording identification information of the antenna feeding port of the base station includes:

sending a test signal to the correspondingly connected antenna port via the antenna feeding port of the base station, where the test signal carries the signal for determining the connection relationship; and recording the identification information of the antenna feeding port of the base station.

According to the foregoing program for executing the method for determining a connection relationship between an antenna feeding port of a base station and an antenna port, preferably, the signal for determining the connection relationship is a binary on-off keying signal.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A method for determining a connection relationship between an antenna feeding port of a base station and an antenna port, the method comprising:

receiving, via an antenna port, a signal for determining the connection relationship sent by the base station, and acquiring the signal for determining the connection relationship via a smart feeding unit in an antenna and a port of a remote control unit in the antenna, wherein the antenna port, the smart feeding unit, and the port of the remote control unit are in a one-to-one correspondence;

determining, according to the smart feeding unit and the port of the remote control unit that acquire the signal for determining the connection relationship, the antenna port that receives the signal for determining the connection relationship; and sending, to the base station, at least one of identification information of the antenna port that receives the signal for determining the connection relationship, and identification information of an antenna corresponding to the antenna port.

2. The method according to claim 1, wherein the signal for determining the connection relationship is a binary on-off keying signal.

3. The method according to claim 1, wherein each antenna and each remote control unit are in a one-to-one correspondence, and the identification information of the antenna is a serial number of a control board in the remote control unit in the antenna.

4. The method according to claim 1, wherein receiving, via an antenna port, a signal for determining the connection relationship sent by the base station, and acquiring the signal for determining the connection relationship via a smart feeding unit in an antenna and a port of a remote control unit in the antenna comprises:

receiving, via an antenna port, a test signal sent by the base station;

performing, via the smart feeding unit in the antenna, signal separation on the test signal to acquire the signal for determining the connection relationship; and transmitting the signal for determining the connection relationship that is separated out to the correspondingly connected port of the remote control unit.

5. A method for determining a connection relationship between an antenna feeding port of a base station and an antenna port, the method comprising:

sending a signal for determining the connection relationship to a correspondingly connected antenna port via an antenna feeding port of the base station, and recording identification information of the antenna feeding port of the base station;

receiving identification information of an antenna corresponding to the antenna port, wherein the identification information of the antenna corresponding to the antenna port is a serial number of a control board in a remote control unit in the antenna; and determining a connection relationship between the antenna feeding port of the base station and the antenna port according to the recorded identification information of the antenna feeding port of the base station and the identification information of the antenna.

6. The method according to claim 5, wherein sending a signal for determining the connection relationship to a correspondingly connected antenna port via an antenna feeding port of the base station, and recording identification information of the antenna feeding port of the base station comprises:

sending a test signal to the correspondingly connected antenna port via the antenna feeding port of the base station, wherein the test signal carries the signal for determining the connection relationship; and recording the identification information of the antenna feeding port of the base station.

7. The method according to claim 5, wherein the signal for determining the connection relationship is a binary on-off keying signal.

8. An apparatus for determining a connection relationship between an antenna feeding port of a base station and an antenna port, the apparatus comprising:
- an antenna port, configured to receive a signal for determining the connection relationship sent by the base station;
- a smart feeding unit, connected to the antenna port, configured to acquire the signal for determining the connection relationship;
- a port of a remote control unit in the antenna, configured to acquire the signal for determining the connection relationship;
- wherein the antenna port, the smart feeding unit, and the port of the remote control unit are in a one-to-one correspondence;
- the remote control unit, further configured to determine, according to the smart feeding unit and the port of the remote control unit that acquire the signal for determining the connection relationship, the antenna port that receives the signal for determining the connection relationship; and
- a transmitter, configured to send, to the base station, at least one of identification information of the antenna port determined by the remote control unit, and identification information of an antenna corresponding to the antenna port.

9. The apparatus according to claim 8, wherein the signal for determining the connection relationship is a binary on-off keying signal.

10. The apparatus according to claim 8, wherein each antenna and each remote control unit are in a one-to-one correspondence, and the identification information of the antenna is a serial number of a control board in the remote control unit in the antenna.

11. The apparatus according to claim 8, wherein the smart feeding unit is configured to:
- receive a test signal sent by the base station;
- perform signal separation on the test signal to acquire the signal for determining the connection relationship; and
- transmit the signal for determining the connection relationship that is separated out to the correspondingly connected port of the remote control unit.

12. An apparatus for determining a connection relationship between an antenna feeding port of a base station and an antenna port, the apparatus comprising:
- an antenna feeding port; and
- a processor, configured to:
  - send a signal for determining the connection relationship to a correspondingly connected antenna port via an antenna feeding port of the base station, and record identification information of the antenna feeding port of the base station;
  - receive identification information of an antenna corresponding to the antenna port, wherein the identification information of the antenna corresponding to the antenna port is a serial number of a control board in a remote control unit in the antenna; and
  - determine a connection relationship between the antenna feeding port of the base station and the antenna port according to the recorded identification information of the antenna feeding port of the base station and the identification information of the antenna.

13. The apparatus according to claim 12, wherein the processor is further configured to:
- send a test signal to the correspondingly connected antenna port via the antenna feeding port of the base station, wherein the test signal carries the signal for determining the connection relationship; and
- record the identification information of the antenna feeding port of the base station.

14. The apparatus according to claim 12, wherein the signal for determining the connection relationship is a binary on-off keying signal.

15. A base station system, comprising:
- a base station with an antenna feeding port and an antenna with an antenna port, the antenna feeding port of the base station and the antenna port are connected in a one-to-one fashion;
- wherein the antenna further comprises:
  - a smart feeding unit, in a one-to-one correspondence with the antenna port, and configured to separate and acquire the signal for determining the connection relationship received from the antenna port;
  - a remote control unit, wherein a port of the remote control unit and the smart feeding unit are connected in a one-to-one fashion, and wherein the remote control unit is configured to:
    - determine, according to the smart feeding unit and the port of the remote control unit that acquire the signal for determining the connection relationship, the antenna port that receives the signal for determining the connection relationship, and
    - send, to the base station, at least one of identification information of the antenna port determined by the remote control unit, and identification information of an antenna corresponding to the antenna port.

16. The base station system according to claim 15, wherein a quantity of antennas is at least two, and a quantity of remote control units matches a quantity of antennas.

17. The base station system according to claim 15, wherein the signal for determining the connection relationship is a binary on-off keying signal.

18. The base station system according to claim 15, wherein:
- each antenna and each remote control unit are in a one-to-one correspondence; and
- the identification information of the antenna is a serial number of a control board in the remote control unit.

19. The base station system according to claim 15, wherein the smart feeding unit is configured to:
- receive a test signal sent by the base station;
- perform signal separation on the test signal to acquire the signal for determining the connection relationship; and
- transmit the signal for determining the connection relationship that is separated out to the correspondingly connected port of the remote control unit.

* * * * *